United States Patent
Wu et al.

(10) Patent No.: US 10,462,918 B2
(45) Date of Patent: Oct. 29, 2019

(54) STORAGE STRUCTURE, ELECTRONIC SYSTEM HAVING THE SAME AND HOUSING FOR ELECTRONIC DEVICE

(71) Applicant: ABILITY ENTERPRISE CO., LTD., New Taipei (TW)

(72) Inventors: Tzu-Peng Wu, New Taipei (TW); Wei-Hsiang Huang, New Taipei (TW); Chien-Tsun Kuo, New Taipei (TW)

(73) Assignee: ABILITY ENTERPRISE CO., LTD., New Taipei (TW)

( * ) Notice: Subject to any disclaimer, the term of this patent is extended or adjusted under 35 U.S.C. 154(b) by 127 days.

(21) Appl. No.: 15/361,024

(22) Filed: Nov. 24, 2016

(65) Prior Publication Data

US 2017/0150625 A1    May 25, 2017

(30) Foreign Application Priority Data

Nov. 25, 2015 (TW) .............................. 104139246 A

(51) Int. Cl.
| | | |
|---|---|---|
| *H05K 5/02* | (2006.01) | |
| *H05K 5/03* | (2006.01) | |
| *G06F 1/16* | (2006.01) | |
| *G03B 17/08* | (2006.01) | |

(52) U.S. Cl.
CPC ......... *H05K 5/0247* (2013.01); *H05K 5/0217* (2013.01); *H05K 5/0221* (2013.01); *H05K 5/0226* (2013.01); *H05K 5/0239* (2013.01); *H05K 5/03* (2013.01); *G03B 17/08* (2013.01); *G06F 1/1628* (2013.01)

(58) Field of Classification Search
CPC ...... H05K 5/0247; H05K 5/0226; H05K 5/03; H05K 5/0217; H05K 5/0221; H05K 5/0239; G06F 1/1628; G03B 17/08
See application file for complete search history.

(56) References Cited

U.S. PATENT DOCUMENTS

| | | | | |
|---|---|---|---|---|
| 5,932,855 A | * | 8/1999 | Wang ..................... | G06F 1/1626 200/50.04 |
| 6,339,699 B1 | * | 1/2002 | Hirai .................... | B60R 11/0241 379/413.01 |
| 7,817,436 B2 | * | 10/2010 | Peiker .................... | B60R 11/02 361/755 |
| 2009/0084040 A1 | * | 4/2009 | Kondo ................ | H01M 2/1066 49/394 |
| 2012/0182465 A1 | * | 7/2012 | Lin ....................... | H04N 5/2256 348/371 |
| 2012/0325723 A1 | * | 12/2012 | Carnevali ............. | G06F 1/1628 206/777 |

* cited by examiner

*Primary Examiner* — Nidhi Thaker
(74) *Attorney, Agent, or Firm* — McClure, Qualey & Rodack, LLP

(57) ABSTRACT

A storage structure includes a cover, a main body, and a movable element. The main body includes a first board and a cavity. The first board has a first opening. The cover connects to the main body. The movable element is accommodated in the cavity and selectively disposed in the first opening.

20 Claims, 6 Drawing Sheets

STORAGE STRUCTURE, ELECTRONIC SYSTEM HAVING THE SAME AND HOUSING FOR ELECTRONIC DEVICE

This application claims the benefit of Taiwan application Serial No. 104139246, filed Nov. 25, 2015, the subject matter of which is incorporated herein by reference.

BACKGROUND OF THE INVENTION

Field of the Invention

The invention relates in general to a storage structure, and more particularly to a storage structure capable of preventing the exposed contacts from being damaged.

Description of the Related Art

Digital Camera is very convenient photograph equipment with which the user can take a picture or record a video anytime and anywhere. Further, the digital camera is provided with a variety of peripheral accessories for user to take pictures or record videos under different circumstances. For instance, when diving under the sea and taking pictures of the scenery of the seabed with the digital camera, the user needs to use the peripheral accessories having functions of waterproof and additional power supply along with the digital camera, such as a waterproof shell, a battery pack and a battery for expandable function. With the aid of the waterproof shell having function of waterproof as well as the battery pack provided with the battery and installed into the digital camera, the user do not need to worry about that if the battery runs down, he/she needs to especially swim ashore to replace the battery. In addition, it may prevent the water from penetrating into the waterproof shell, destroying the electronic elements inside of the digital camera. Therefore, the user can be assured of taking pictures under the sea.

The battery pack is usually provided with a set of bumped electrical contacts for being contacted with the electrical module on the bottom of the digital camera, so as to transmit the electrical power to the digital camera. When the user installs the battery pack and the digital camera into the waterproof shell, firstly, the user installs the battery pack into the bottom of the waterproof shell, and then installs the digital camera into the waterproof shell so that the electrical module of the digital camera contacts with the electrical contacts of the battery pack. However, since the electrical contacts of the battery pack are bumped, the bumped electrical contacts are often scratched by the bottom of the digital camera when the digital camera is installed into the waterproof shell. As time goes by, the repeated scratches will result in the electrical contacts being damaged or poorly connected.

As such, it is necessary to provide a novel battery pack capable of preventing the electrical contacts from being scratched and damaged by the digital camera.

SUMMARY OF THE INVENTION

Therefore, a storage structure, an electronic system having the same and a housing for the electronic device are provided herein, wherein the damage of the exposed electrical contacts may be avoided.

A storage structure including a cover, a main body, and a movable element is provided herein. The main body includes a board and a cavity. The board has a first opening. The movable element is accommodated in the cavity and selectively disposed in the first opening.

A storage structure including a cover, a main body, and a movable element is further provided herein. The main body includes a board and a cavity. The board has a first opening. The movable element is accommodated in the cavity. The movable element is exposed from the first opening, or the movable element is detached from the first opening.

A storage structure including a cover, a main body, and a movable element is also provided herein. The main body includes a board and a cavity. The board has a first opening. The movable element is accommodated in the cavity and disposed in the first opening.

An electronic system is provided. The electronic system includes an electronic device and a storage structure. The storage structure includes a cover, a main body, and a movable element. The main body includes a board and a cavity. The board has a first opening. The movable element is accommodated in the cavity and selectively disposed in the first opening. The electronic device is accommodated in the cavity and electrically connected to the movable element The above and other aspects of the invention will become better understood with regard to the following detailed description of the preferred but non-limiting embodiment(s). The following description is made with reference to the accompanying drawings.

DETAILED DESCRIPTION OF THE INVENTION

In order to provide a better understanding of the technical contents of the present invention for the Examiner, preferred embodiments are particularly exemplified below.

Figure 1:
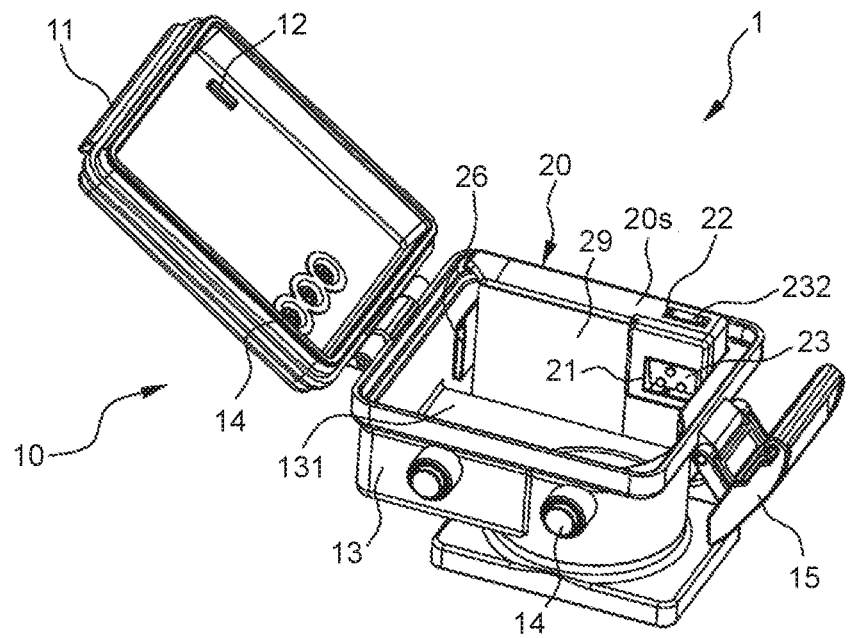
FIG. 1 is a schematic drawing of a storage structure according to one embodiment of the present invention.
Figure 2:
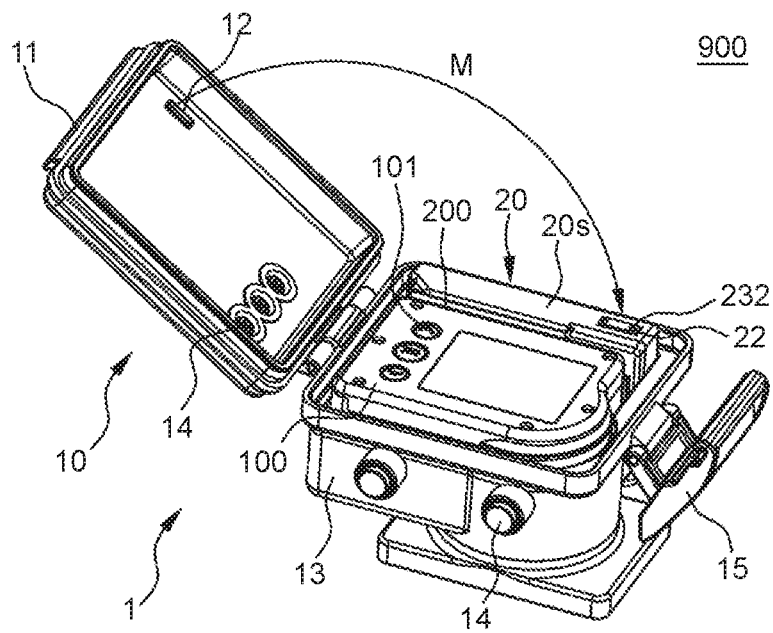
FIG. 2 is a schematic drawing of the storage structure accommodating an electronic device and an expansion device according to one embodiment of the present invention.
Figure 3:
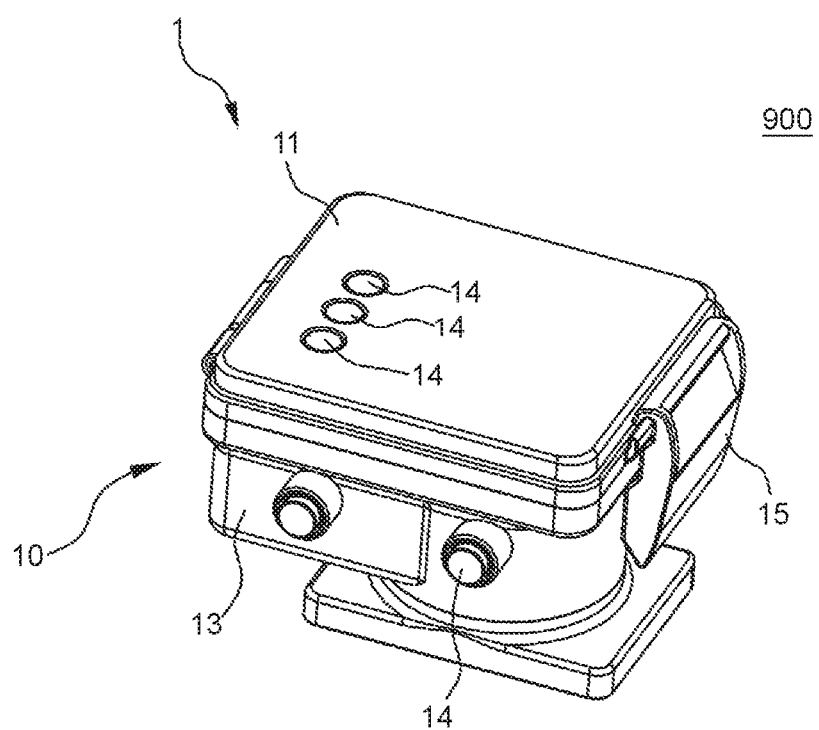
FIG. 3 is a schematic drawing of the storage structure showing a cover covering a main body according to one embodiment of the present invention.
Figure 4:
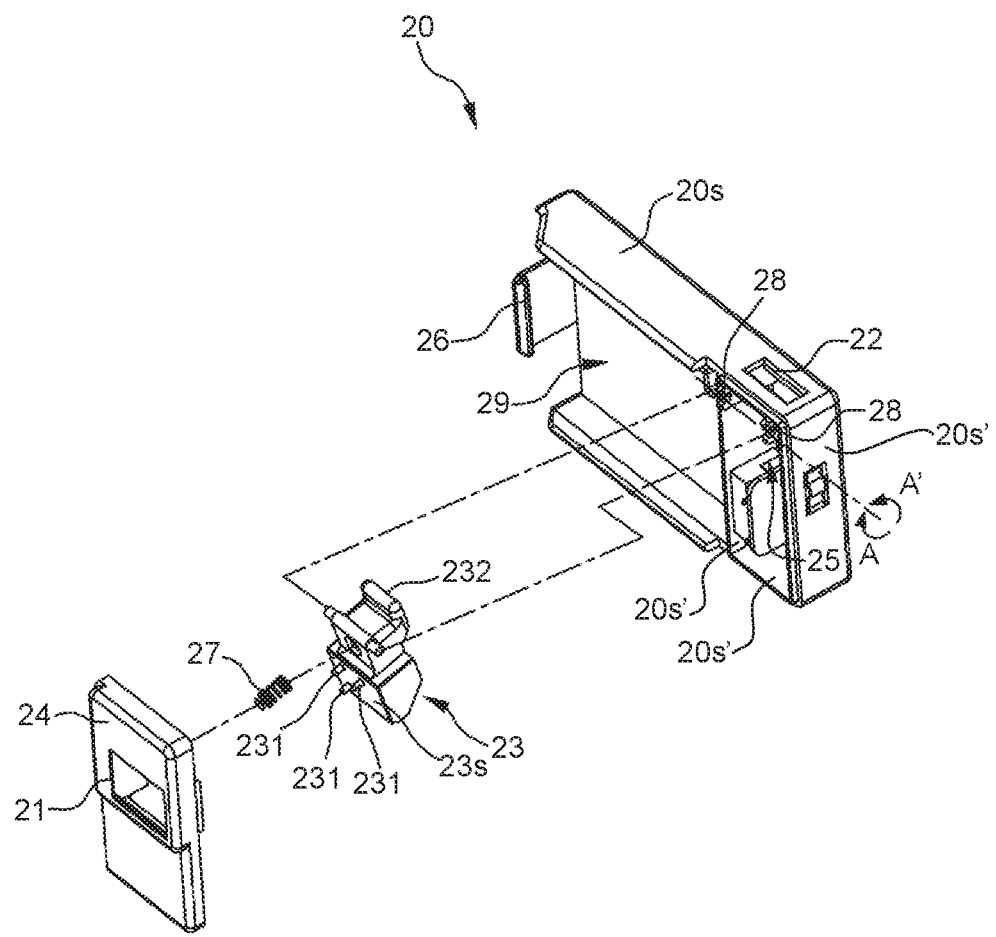
FIG. 4 is an exploded drawing of a board according to one embodiment of the present invention.
Figure 5:
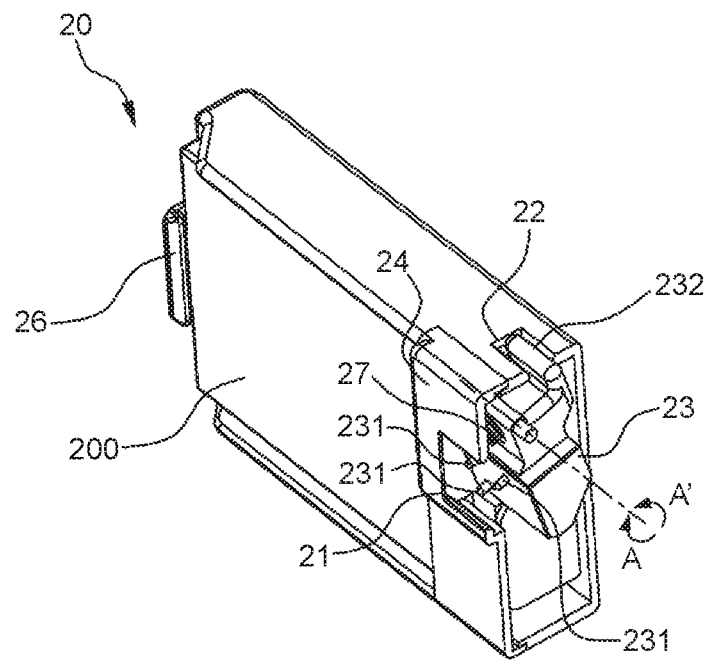
FIG. 5 is a schematic drawing showing that a movable element is detached from a first opening according to one embodiment of the present invention.
Figure 6:
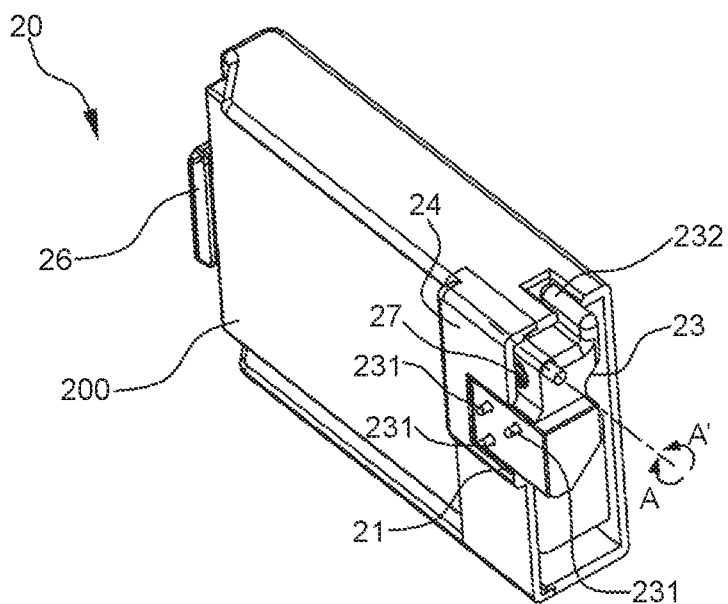
FIG. 6 is a schematic drawing showing that the movable element is exposed from the first opening according to one embodiment of the present invention.
Figure 7:
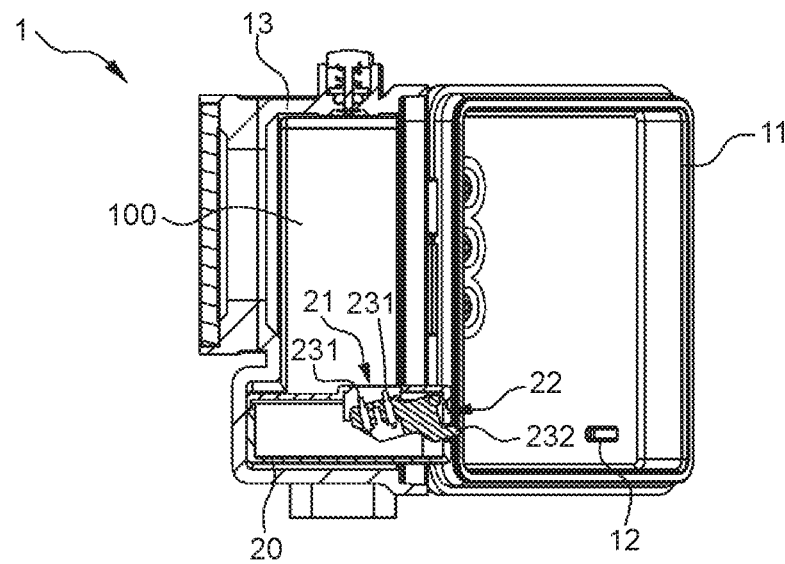
FIG. 7 is a cross-sectional view of the storage structure showing that the movable element is detached from the first opening according to one embodiment of the present invention.
Figure 8:
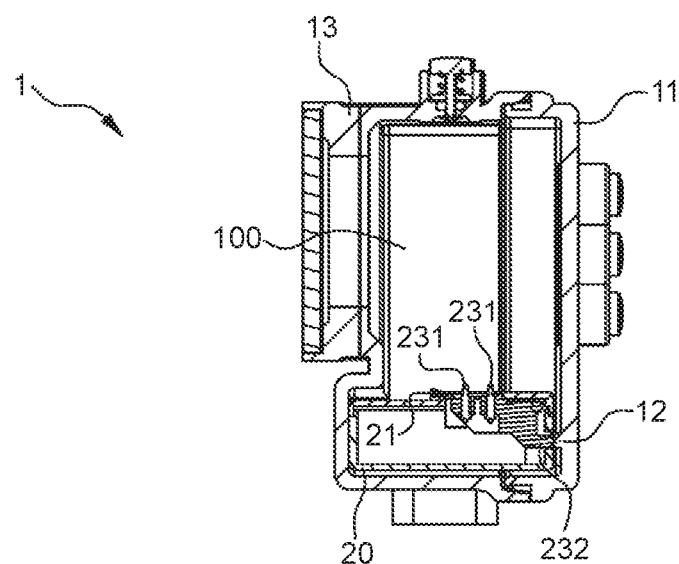
FIG. 8 is a cross-sectional view of the storage structure showing that the movable element is exposed from the first opening according to one embodiment of the present invention.
Figure 9:
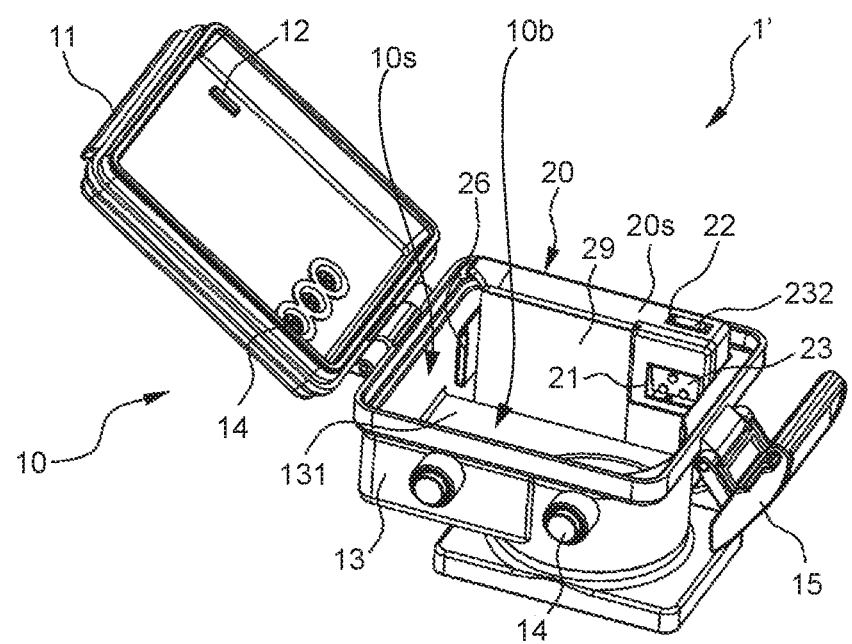
FIG. 9 a schematic drawing of a storage structure according to one embodiment of the present invention.

Hereinafter, the storage structure according to one embodiment of the present invention will be described with reference to FIGS. 1-9. FIG. 1 is a schematic drawing of a storage structure according to one embodiment of the present invention. FIG. 2 is a schematic drawing of the storage structure accommodating an electronic device and an expansion device according to one embodiment of the present invention. FIG. 3 is a schematic drawing of the storage structure showing a cover covering a main body according to one embodiment of the present invention. FIG. 4 is an exploded drawing of a board according to one embodiment of the present invention. FIG. 5 is a schematic drawing showing that a movable element is detached from a first opening according to one embodiment of the present invention. FIG. 6 is a schematic drawing showing that the movable element is exposed from the first opening according to one embodiment of the present invention. FIG. 7 is a cross-sectional view of the storage structure showing that the movable element is detached from the first opening according to one embodiment of the present invention. FIG. 8 is a cross-sectional view of the storage structure is showing that the movable element is exposed from the first opening according to one embodiment of the present invention. FIG. 9 a schematic drawing of a storage structure according to one embodiment of the present invention.

As shown in FIGS. 1-3, of one embodiment of the present invention, the storage structure 1 includes a cover 11, a main body 13 and a movable element 23. The main body 13 forms a cavity 131 and includes a first board 24. The cover 11 has a protrusion 12 and is connected to the main body 13. The protrusion 12 is disposed on the cover 11, and the movable element 23 is accommodated in the cavity 131. The cavity 131 may be a first accommodation space of the main body 13, such as a concave space or a hollow space. Alternatively, the cavity 131 may be integrally formed. The cavity 131 may be formed in arbitrary shape or the like, or even the shape of the cavity 131 may be substantially the same as the object accommodated in the cavity 131. However, the present invention is not limited thereto. Moreover, the shape of the main body 13 may be a cuboid, a cube, a quadrangular prism, etc., but the present invention is not limited thereto.

As shown in FIGS. 1-3, of one embodiment of the present invention, the cover 11 and the main body 13 may be pivotally connected with each other, but the present invention is not limited thereto. The cover 11 and the main body 13 may further construct a first casing 10 for accommodating and protecting various devices.

As shown in FIG. 9, of another embodiment of the present invention, the storage structure 1' may further be a housing for an electronic device 100. The electronic device 100 may be accommodated in the housing. The storage structure 1' of FIG. 9 is approximately the same as the storage structure 1 of FIGS. 1-3, and the same elements are denoted by the same reference numerals. The main difference between the storage structure 1' of FIG. 9 and the storage structure 1 of FIG. 1 is: the shape of the cavity 131 may be formed in a cube. The main body 13 has four faces 10s and one bottom face 10b. Two faces of the four faces 10s are oppositely disposed, while the other two faces of the four faces 10s are oppositely disposed. The bottom face 10b connects with the four faces 10s so as to form the cavity 131. The movable element 23 and the electronic device 100 are accommodated in the cavity 131. When the cover 11 is disposed on the main body 13, the cover 11 corresponds to the bottom face 10b, or the cover 11 is substantially parallel to the bottom face 10b.

As shown in FIGS. 1-2, the storage structure 1 according to one embodiment of the present invention may further accommodate an electronic device 100 so as to construct an electronic system 900. Besides, the storage structure 1 may further accommodate an expansion device 200 electrically connected to the electronic device 100 so as to obtain additionally expandable function. That is, the electronic device 100 and the expansion device 200 may further be accommodated in the cavity 131. For example, the storage structure 1 may be a casing having functions of waterproof and/or dust proof, but the present invention is not limited thereto. Of one embodiment of the present invention, the electronic device 100 may be a camera, a mobile phone, a tablet, a video camera or an image capturing device. The electronic device 100 may also be a portable device, but the present invention is not limited thereto. The expansion device 200 may be a battery, but may also be other peripheral expansion electronic equipment used with the electronic device 100, such as a memory card or a hard disc. However, the present invention is not limited thereto. Here, the electronic device 100 is exemplified to be electrically connected to the expansion device 200 to obtain additional electrical power.

As shown in FIGS. 1-3, the storage structure 1 of the present embodiment may be transformed into a first state, into a second state, or between the first state and the second state. The first state may be an open state, and the second state may be a closed state, but the present invention is not limited thereto. As shown in FIG. 2, in the present embodiment, the storage structure 1 is in the first state. As shown in FIGS. 2-3, while the storage structure 1 is transformed from the first state into the second state, the cover 11 may move along a first direction M and be disposed on the main body 13. That is, the cover 11 covers the main body 13 tightly, while the electronic device 100 and the expansion device 200 are sealed in the cavity 131. At this time, as shown in FIG. 3, the storage structure 1 is in the second state, so that the storage structure 1 may prevent the external water or dust from entering the main body 13. In the present embodiment, such as the case when the electronic device 100 and/or the expansion device 200 need to be replaced according to the need of the user, the storage structure 1 is transformed from the second state into the first state. That is, the cover 11 may move along a direction reverse to the first direction M and not be disposed on the main body 13.

As shown in FIGS. 1-2 and FIG. 9, in one embodiment, the cover 11 has a face which may correspond to the cavity 131 or may further correspond to the bottom face 10b. The protrusion 12 may protrude from the face of the cover 11 towards the cavity 131 and may be fixed on the cover 11. The protrusion 12 may be a pillar, a column or a protrusion, or may be integrally formed with the cover 11. Besides, the protrusion 12 may also be movably disposed on the cover 11. For example, the protrusion 12 may be received within the cover 11, while the protrusion 12 may protrude from the face of the cover 11 in accordance with sliding or being pushed from the cover 11 towards the cavity 131. Alternatively, the protrusion 12 may protrude from the face of the cover 11 in accordance with sliding or being pushed from the edge of the cover 11 towards the center of the cover 11 or from the center of the cover 11 towards the edge of the cover 11. Alternatively, the protrusion 12 may protrude from the face of the cover 11 towards the cavity 131 in accordance with being pressed. Alternatively, the protrusion 12 may protrude from the face of the cover 11 towards the cavity 131 in accordance with being triggered.

As shown in FIGS. 1-3, in the present embodiment, the main body 13 further has a lock 15 connected to the main body 13. After the cover 11 moves along the first direction M and is disposed on the main body 13, the lock 15 engages with the edge of the cover 11. Therefore, the cover 11 covers the main body 13 tightly so as to ensure that the electronic device 100 and the expansion device 200 are sealed within the cavity 131 to prevent from the external dust or water. In the present embodiment, the lock 15 may be a buckle or an element which may engage or fasten with each other, but the present invention is not limited thereto. Besides, the lock 15 may also be connected to the cover 11. When the cover 11 covers the main body 13 tightly, the lock 15 engages with the edge of the main body 13 to achieve effects of waterproof and dust proof.

As shown in FIGS. 1-3, the storage structure 1 further has a plurality of keys 14 disposed on the cover 11 and the main body 13, respectively. The electronic device 100 has a plurality of operational keys 101, wherein each key 14 is correspondingly disposed on the operational key 101 of the electronic device 100. When the user presses the key 14 on the main body 13, the key 14 presses the corresponding operational key 101 on the electronic device 100. Therefore, the user can operate the electronic device 100 within the main body 13. For example, the user can operate the electronic device 100 to photograph, set up functions of the electronic device 100 or the like.

As shown in FIGS. 4-6, in one embodiment of the present invention, the first board 24 is accommodated in the cavity 131 of the main body 13 and has a first opening 21. Further, the first board 24 may be connected to one of the faces of the main body 13.

In one embodiment of the present invention, the main body 13 further includes a second board 20s, and the second board 20s has a second opening 22. The first board 24 and the second board 20s are both accommodated in the cavity 131. The first board 24 connects to the second board 20s. The second board 20s may be connected to one of the faces of the main body 13. In addition, an angle may be further formed between the first board 24 and the second board 20s and a second accommodation space 25 formed therebetween. The movable element 23 may be disposed between the first board 24 and the second board 20s, and may further be accommodated in the second accommodation space 25. In the present embodiment, the electronic device 100 is further disposed on the first board 24.

As shown in FIG. 4, in one embodiment of the present invention, the main body 13 further includes a plurality of boards 20s'. The first board 24, the second board 20s and the boards 20s' may further construct a second casing 20 accommodated in the cavity 131 and having the second accommodation space 25. The movable element 23 is accommodated in the second accommodation space 25, and the electronic device 100 is further disposed on the second casing 20.

Besides, the storage structure 1 further includes a fixed component 26. The main body 13 further forms a third accommodation space 29. The fixed component 26 is disposed in the cavity 131 or in the third accommodation space 29. The second accommodation space 25 is adjacent to the third accommodation space 29. The expansion device 200 may be fixed in the cavity 131 or in the third accommodation space 29 in accordance with the fixed component 26, thereby preventing the expansion device 200 being detached from the main body 13. The expansion device 200 accommodated in the accommodation space 29 is exemplified herein. In the present embodiment, the fixed component 26 may be a hook, a projection or the like, but the present invention is not limited thereto.

As shown in FIGS. 4-6, in one embodiment of the present invention, the main body 13 further includes an elastic element 27, and the elastic element 27 is disposed and connected between the first board 24 and the movable element 23. The movable element 23 moves towards a third direction A' in accordance with the elastic force of the elastic element 27. In the present embodiment, the elastic element 27 may be a spring, but may be a material having elasticity as well. However, the present invention is not limited thereto.

As shown in FIGS. 4-6, in one embodiment of the present invention, the main body 13 further includes at least one pivot 28. The pivot 28 is disposed between the first board 24 and the second board 20s, and further disposed within the second accommodation space 25. The first board 24 is disposed on the second accommodation space 25; meanwhile, the first board 24 may cover the movable element 23 and the pivot 28.

In the present embodiment, the movable element 23 may be pivotally connected to the pivot 28 to move between the first opening 21 and the second opening 22. In other words, the movable element 23 may pivot about the pivot 28 so as to move towards a second direction A or a third direction A'. In the present embodiment, the second direction A or the third direction A' belongs to a rotational movement, but the present invention is not limited thereto.

As shown in FIGS. 4-6, the movable element 23 includes a first portion and a second portion. The first portion of the movable element 23 is selectively disposed in the first opening 21. That is, the first portion of the movable element 23 may be disposed in the first opening 21 or not be disposed in the first opening 21. In other words, the first portion of the movable element 23 may further be exposed from the first opening 21 or be detached from the first opening 21. The second portion of the movable element 23 is selectively disposed in the second opening 22. Further, the second portion of the movable element 23 moves towards a third direction A' to be disposed in the second opening 22 in accordance with the elastic force of the elastic element 27. For example, when the second portion of the movable element 23 may be disposed in the second opening 22, the first portion of the movable element 23 may be detached from the first opening 21. Another example, the first portion of the movable element 23 may be disposed in the first opening 21 and/or the second portion of the movable element 23 may be disposed in the second opening 22. But the present invention is not limited thereto.

The movable element 23 includes a plurality of contacts 231 disposed in the first portion of the movable element 23. In the present embodiment, the number of the contacts 231 is three, for example. However, the number of the contacts 231 is not limited to three, but can be changed according to the design requirement. The contacts 231 are disposed on a side face 23s of the first portion of the movable element 23 and correspond to the first opening 21. In the present embodiment, the movable element 23 further includes a circuit structure (not shown). The circuit structure is electrically connected to the contacts 231 and the expansion device 200, respectively. When the movable element 23 moves towards the second direction A, the contacts 231 of the movable element 23 is disposed in the first opening 21 and connected to the electronic device 100 through the first opening 21.

As shown in FIGS. 4, 6 and 8, at the same time, the side face 23s of the movable element 23 connects to the first opening 21. The contacts 231 pass through the first opening 21 and are exposed from the first opening 21. That is, the contacts 231 are further protruded from the surface of the first board 24 substantially. In addition, the contacts 231 are electrically conductive. When the contacts 231 are electrically connected to the electronic device 100, the electrical power is transmitted to the electronic device 100 in accordance with the contacts 231.

As shown in FIGS. 4, 5 and 7, when the movable element 23 moves towards the third direction N, the side face 23s of the movable element 23 does not connect to the first opening 21. The contacts 231 do not pass through the first opening 21. That is, the contacts 231 are not protruded from the surface of the first board 24, or alternatively, the contacts 231 move from the first opening 21 towards the second board 20s, thereby moving away from the first board 24. That is, the contacts 231 of the movable element 23 are detached from the first opening 21.

In one embodiment of the present invention, the movable element 23 further includes an abutting portion 232. The abutting portion 232 may be disposed in the first portion or the second portion of the movable element 23. The abutting portion 232 may be disposed corresponding to the first opening 21 or the second opening 22. The abutting portion 232 is exemplified to be disposed in the second portion of the movable element 23 and to be corresponding to the second opening 22. When the storage structure 1 is at the first state, the abutting portion 232 is disposed in or exposed from the second opening 22. When the storage structure 1 is at the second state, the protrusion 12 further corresponds to the abutting portion 232, and the second opening 22 is disposed between the protrusion 12 and the abutting portion 232. That is, the protrusion 12 is connected to the abutting portion 232 of the movable element 23 through the second opening 22. The protrusion 12 contacts with and pushes against the abutting portion 232 to drive the movable element 23 to move towards the second direction A.

In another embodiment of the present invention, the movable element 23 further includes a plurality of contacts 231 and an abutting portion 232 disposed the first portion and the second portion of the movable element 23, respectively. Each contact 231 may be disposed in the first opening 21. That is, the side face 23s of the movable element 23 connects to the first opening 21. Therefore, the contacts 231 pass through the first opening 21. That is, the contacts 231 are exposed from the first opening 21. Substantially, the contacts 231 are further protruded from the surface of the first board 24. Meanwhile, the abutting portion 232 of the movable element 23 is disposed in the second opening 22. Further, the abutting portion 232 of the movable element 23 may be exposed from the second opening 22. In the present embodiment, the contacts 231 may have stretchability or elasticity. In other words, the contacts 231 may be adjustably disposed in the first portion of the movable element 23. When the electronic device 100 is disposed on the first board 24, there is no additional space to accommodate the contacts 231 since the movable element 23 contacts with the electronic device 100. Therefore, the contacts 231 and the electronic device 100 are compressed with each other to compress the lengths of the contacts 231. The lengths of the contacts 231 are thereby changed; substantially, the lengths of the contacts 231 are reduced, but the present invention is not limited thereto. The lengths of the contacts 231 can be changed to avoid the scratch of the electronic device 100.

As shown in FIGS. 2, 5 and 7, when the storage structure 1 is at the first state, the movable element 23 may be pushed to move towards the third direction A' in accordance with the elastic force of the elastic element 27. Meanwhile, the abutting portion 232 of the movable element 23 is disposed in the second opening 22, and the contacts 231 are detached from the first opening 21. As shown in FIGS. 2, 3, 6 and 8, while the storage structure 1 is transformed from the first state into the second state, the cover 11 moves along the first direction M and then is disposed on the main body 13. Meanwhile, the protrusion 12 is driven with the cover 11 to move along the first direction M and passes through the second opening 22 for being contacted with the abutting portion 232 of the movable element 23. While the storage structure 1 is transformed into the second state, the movable element 23 is pushed to move towards the second direction A in accordance with the protrusion 12, and each contact 231 of the movable element 23 is disposed in and further exposed from the first opening 21. While the storage structure 1 is transformed from the second state into the first state, the cover 11 and the main body 13 are detached along a direction reverse to the first direction M. At this time, the storage structure 1 returns back to the first state.

As shown in FIGS. 1-8, in one embodiment of the present invention, if the user wants to install the electronic device 100 and the expansion device 200 into the storage structure 1 of the present invention, firstly, the user may install the expansion device 200 into the cavity 131 or the third accommodation space 29, and use the fixed component 26 to fix the expansion device 200. Afterwards, the user may install the electronic device 100 into the cavity 131 and place the electronic device 100 on the first board 24. In the present embodiment, the electronic device 100 and the expansion device 200 may be placed into the storage structure 1 in order, and vice versa. However, the present invention is not limited thereto.

As shown in FIGS. 5 and 7, at this time, the movable element 23 is pushed to move towards the third direction A' in accordance with the elastic force of the elastic element 27, while the contacts 231 are detached from the first opening 21. Therefore, when the user places the expansion device 200 first and then places the electronic device 100 into the cavity 131 and further on the first board 24, or when the user places the electronic device 100 into the cavity 131 and further on the first board 24 first and then places the expansion device 200 into the third accommodation space 29 and further under the electronic device 100, the abutting portion 232 is exposed from the second opening 22 and the contacts 231 are detached from the first opening 21. Therefore, the bottom of the electronic device 100 will not contact with the contacts 231 to prevent the contacts 231 from being scratched by the electronic device 100. Afterwards, as shown in FIGS. 2, 3, 6 and 8, the user may move the cover 11 along the first direction M and place it on the main body 13. Also, the protrusion 12 moves along the first direction M and passes through the second opening 22 for being contacted with the abutting portion 232 of the movable element 23. The protrusion 12 further pushes against the abutting portion 232 so that the movable element 23 moves towards the second direction A, and each contact 231 is exposed from the first opening 21. As a result, the contacts 231 are electrically connected to and conduct the expansion device 200 and the electrical module (not shown) on the bottom of the electronic device 100, respectively. The electrical power of the expansion device 200 is transmitted to the electronic device 100 in accordance with the contacts 231.

According to the storage structure 1 of one embodiment of the present invention, when the user places the electronic device 100 into the storage structure 1 and the electronic device 100 is disposed on the first board 24, the bottom of the electronic device 100 will not contact with the contacts 231 to prevent the contacts 231 from being scratched by the electronic device 100.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A storage structure comprising:
   a main body forming a cavity and comprising a first board, the first board accommodated in the cavity and having a first opening;
   a movable element accommodated in the cavity and rotatable relative to the first board on a rotational axis substantially parallel to the first opening, a first portion of the movable element selectively disposed in the first opening; and
   a cover connecting to the main body, the cover touching the movable element while being disposed on the main body, and the cover separating from the movable element while not being disposed on the main body.

2. The storage structure according to claim 1, wherein the movable element further comprises a plurality of contacts and an abutting portion, the contacts or the abutting portion is disposed in the first portion of the movable element.

3. The storage structure according to claim 1, wherein the movable element comprises a plurality of contacts and an abutting portion, the contacts and the abutting portion are disposed in the first portion and a second portion of the movable element, respectively.

4. The storage structure according to claim 3, wherein the cover comprises a protrusion, when the protrusion connects to the abutting portion, the contacts are disposed in the first opening.

5. The storage structure according to claim 3, wherein the main body comprises a second board, the second board is accommodated in the cavity and has a second opening, an angle is formed between the first board and the second board, the movable element is disposed between the first board and the second board.

6. The storage structure according to claim 5, wherein the main body further comprises an elastic element disposed between the first board and the movable element, the abutting portion is disposed in the second opening in accordance with the elastic element, and the contacts are detached from the first opening.

7. The storage structure according to claim 1, wherein the storage structure is further used for an electronic device, the movable element comprises a plurality of contacts disposed in the first portion of the movable element, when the contacts are disposed in the first opening, the movable element is electrically connected to the electronic device with the contacts.

8. An electronic system comprising:
   an electronic device; and
   the storage structure according to claim 1, wherein the electronic device is accommodated in the cavity, the movable element is selectively electrically connected to the electronic device.

9. A storage structure comprising:
   a main body forming a cavity and comprising a first board, the first board accommodated in the cavity and having a first opening;
   a movable element accommodated in the cavity and rotatable relative to the first board on a rotational axis substantially parallel to the first opening, a first portion of the movable element exposed from the first opening, or the first portion of the movable element detached from the first opening; and
   a cover connecting to the main body, the cover touching the movable element while being disposed on the main body, and the cover separating from the movable element while not being disposed on the main body.

10. The storage structure according to claim 9, wherein the movable element further comprises a plurality of contacts and an abutting portion, the contacts or the abutting portion is disposed in the first portion of the movable element.

11. The storage structure according to claim 9, wherein the movable element comprises a plurality of contacts and an abutting portion, the contacts and the abutting portion are disposed in the first portion and a second portion of the movable element, respectively.

12. The storage structure according to claim 11, wherein the cover comprises a protrusion, when the protrusion connects to the abutting portion, the contacts are exposed from the first opening.

13. The storage structure according to claim 11, wherein the main body comprises a second board, the second board is accommodated in the cavity and has a second opening, an angle is formed between the first board and the second board, the movable element is disposed between the first board and the second board.

14. The storage structure according to claim 13, wherein the main body further comprises an elastic element disposed between the first board and the movable element, the abutting portion is exposed from the second opening in accordance with the elastic element, and the contacts are detached from the first opening.

15. A housing for an electronic device comprising:
   a main body forming a cavity and comprising a first board, the first board accommodated in the cavity and having a first opening;
   a movable element accommodated in the cavity and rotatable relative to the first board on a rotational axis substantially parallel to the first opening, a first portion of the movable element disposed in the first opening; and
   a cover connecting to the main body, the cover touching the movable element while being disposed on the main body, and the cover separating from the movable element while not being disposed on the main body.

16. The housing according to claim 15, wherein the movable element further comprises a plurality of contacts and an abutting portion, and the contacts or the abutting portion is disposed in the first portion of the movable element.

17. The housing according to claim 15, wherein the movable element comprises a plurality of contacts and an abutting portion, the contacts and the abutting portion are disposed in the first portion and a second portion of the movable element, respectively.

18. The housing according to claim 17, wherein the cover comprises a protrusion, the protrusion connects to the abutting portion.

19. The housing according to claim 17, wherein the main body comprises a second board, the second board is accommodated in the cavity and having a second opening, an angle is formed between the first board and the second board, the movable element is disposed between the first board and the second board.

20. The housing according to claim 15, wherein the main body further comprises a plurality of contacts, the contacts are disposed in the first portion of the movable element.

* * * * *